United States Patent [19]

Nagase et al.

[11] Patent Number: 5,264,390
[45] Date of Patent: Nov. 23, 1993

[54] METHOD OF AUTOMATIC WIRING IN A SEMICONDUCTOR DEVICE

[75] Inventors: Hachidai Nagase, Hadano; Tatsuki Ishii, Nishitama; Katsuyoshi Suzuki, Hadano, all of Japan

[73] Assignee: Hitachi, Ltd., Tokyo, Japan

[21] Appl. No.: 766,413

[22] Filed: Sep. 26, 1991

[30] Foreign Application Priority Data

Oct. 2, 1990 [JP] Japan .................. 2-263083

[51] Int. Cl.⁵ ...................... H01L 21/44; H01L 21/48
[52] U.S. Cl. .................................. 437/180; 437/195; 437/978; 437/194; 257/210; 257/211; 257/758; 257/760
[58] Field of Search ............... 437/182, 180, 189, 51; 156/643, 659.1; 357/25–74; 364/488–491

[56] References Cited

U.S. PATENT DOCUMENTS

| 4,412,240 | 10/1983 | Kikuchi et al. | 357/45 |
|---|---|---|---|
| 4,673,966 | 6/1987 | Shimoyama | 357/68 |
| 4,746,965 | 5/1988 | Nishi | 357/68 |
| 4,974,049 | 11/1990 | Sueda et al. | 357/45 |
| 5,060,045 | 10/1991 | Owada et al. | 357/45 |
| 5,140,402 | 8/1992 | Murakata | 357/45 |

OTHER PUBLICATIONS

K. A. Chen, et al., "The Chip Layout Problem: An Automatic Wiring Procedure", DA Conference (1977) pp. 298–302.

Primary Examiner—Olik Chaudhuri
Assistant Examiner—H. Jey Tsai
Attorney, Agent, or Firm—Kenyon & Kenyon

[57] ABSTRACT

A method of automatic wiring in a semiconductor integrated circuit device having four or more wiring layers, with the lowest layer being a terminal layer, is intended to overcome the prior art problem in which lower layers are mostly used for wiring and upper layers are not used efficiently. The method is designed to assign longer lines to upper layers distant from the terminal layer, and upper layers can have increased wiring densities with minimal numbers of lines, bends and through holes, thereby using upper layers efficiently.

18 Claims, 6 Drawing Sheets

METHOD OF AUTOMATIC WIRING IN A SEMICONDUCTOR DEVICE

BACKGROUND OF THE INVENTION

The present invention relates to a method of wiring in a semiconductor integrated circuit device, and to a method of computer-based automatic wiring in a semiconductor integrated circuit device having four or more wiring layers of signal lines.

A conventional channel wiring method for semiconductor devices is described in publication DA Conference, pp. 298-302, published in 1977. This technique is intended to form signal lines on four wiring layers, and it includes five modes of wiring. The wiring method based on this conventional technique will be explained with reference to the drawings.

FIG. 8 is a diagram showing examples of 4-layer wiring is five wiring modes based on the above-mentioned conventional technique. FIGS. 9 and 10 are diagrams explaining lead wiring from the first layer to the fourth layer. FIGS. 11, 12 and 13 are diagrams explaining the occurrence of undone wiring resulting from the conventional wiring method. In FIGS. 8 through 13, indicated by 1 are terminals, 2 is first layer wiring, 3 is second layer wiring, 4 is third layer wiring, 5 is fourth layer wiring, 6 are through holes, 7 is a row of cells, and 8 are overall through holes.

Generally, a semiconductor integrated circuit device has an internal formation of multiple rows of cells each constituting such a circuit element as a logic gate, with a wiring area in the form of multiple wiring layers being provided between cell rows so that terminals of cells are interconnected in the wiring area thereby to form various functional circuits. Terminals of cells are usually located on the lowest layer and they are led to proper wiring layers for interconnection. In the above-mentioned conventional technique, terminals are connected with each other in any of the wiring modes illustrated in FIG. 8.

Shown by (a) in FIG. 8 is an example of mode-I wiring which is used to connect terminals 1 of adjacent cell rows 7. Lines from both terminals 1 are led to the first layer, resulting lines 2 on the first layer are further led to the second layer by through holes 6, and finally both terminals are interconnected by a line 3 on the second layer.

Shown by (b) and (c) are examples of mode-II wiring and mode-III wiring which are used to connect a terminal 1 of a cell row 7 to a terminal of another cell row (not shown) across intermediate cell rows. For example, a line from a terminal 1 is led to the second layer by a line 2 on the first layer and a through hole 6 and further led to the third layer by a through hole 6, as in the mode-I connection, and finally connected to a terminal of another cell row by a line 4 on third layer.

Shown by (d) and (e) are mode-IV wiring and mode-V wiring which are used for the connection from one cell row by way of a wiring area to another cell row in other portion (not shown). In mode-IV wiring, a line from other portion is led to the wiring area by a line 4 on the third layer, and both lines are connected by a line 3 on the second layer in the wiring area. In mode-V wiring, other line is led to the wiring area by a line 4 on the third layer, and both lines are connected by a line 5 on the fourth layer in the wiring area.

Although the conventional technique is operative for 4-layer wiring in five kinds of wiring mode, it mostly uses lower layers due to the presence of cell terminals on the lowest layer in general, resulting in the inefficient use of the fourth layer. In the examples of FIG. 8, only mode-V wiring can use the fourth layer.

Another problem of the conventional technique, which is due to lead wiring on the first layer for terminals 1, is that when it is intended to connect terminals in mode-V wiring by using a fourth layer line 5, it is necessary to lead the line from a terminal to the third layer by a second layer line 3 and then connected to a third layer line 4 by the fourth layer line 5 as shown in FIG. 9, resulting in the increased wiring on the second and third layers.

In the above-mentioned case, although it is possible to connect the first layer lines of the terminals 1 to the fourth layer line 5 by overall through holes 8 as shown in FIG. 10, the 3-stage through holes (from first to second layer, from second to third layer, and from third to fourth layer) is not desirable from the viewpoints of the structural quality and thus the yield of manufacturing. On this account, lines are routed generally from the lowest layer to the highest layer sequentially by way of intermediate wiring layers. Even in the case of using overall through holes, through holes on the second and third layers can obstruct other wiring, and therefore it is not desirable.

A further problem of the conventional technique, which is due to the determination of the lead wiring route without the assessment of the utilization factors of individual wiring layers, is that when terminals B are connected together by a second layer line 3, it becomes impossible to interconnect terminals A, as shown in FIG. 11. The figure is a plan view of a chip with a wiring area formed between cells, showing the occurrence of undone wiring 11 if lead wiring to a higher layer is not counted in the distribution of each wiring layer in the x direction.

In the example of FIG. 11, a 2-layer pitch 9 and two 4-layer pitches 10 are disposed between cell rows 7, and the second layer line 3 and fourth layer line 5 in the lateral direction can be formed on the layers of this position. When the terminals B are connected together by a second layer line 3, no more second layer wiring is available even through a vacant fourth layer. Consequently, the line from the terminal A cannot be led to the fourth layer by way of the second layer line 3 and third layer line 4 sequentially, and interconnection between terminals A is left as undone wiring 11 unless overall through holes are used.

FIG. 12 shows an example of the case where wiring is made across a cell row based on the conventional technique. Longitudinal lead wiring routes in the y direction for interconnecting terminals C are assigned in excess of 100% of the sum of utilization factors of individual wiring layers in the lateral (x) direction, causing the failure of interconnection between terminals A of the same cell row as undone wiring 11. In the case of this example, if the wiring layer in the x direction is the fourth layer and the wiring layer in the y direction is the first layer for the wiring of interconnection between terminals C, bends of line arise on the second and third layers and the utilization factor of a longitudinal line will exceed 100%.

FIG. 13 shows an example of interconnection between terminals B and between terminals C based on the conventional technique through the assignment of short lines in the x direction to the fourth layer. Leading many short lines to the fourth layer causes increased utilization factors of the second and third layers, resulting in the occurrence of undone wiring 11 for the interconnection between terminals A.

SUMMARY OF THE INVENTION

As mentioned above, the conventional technique is deficient in the consideration of wiring on wiring layers distant by three or more layers from the layer of terminals (these layers will be termed "upper layers"), and it fails to use the upper layers efficiently. Another problem is extended lines to distant upper layers when accessed from the terminal layer.

The present invention is intended to overcome the foregoing prior art deficiencies, and its prime object is to provide a method of wiring in a semiconductor integrated circuit device capable of minimizing the length of lead wiring from the terminal layer to distant upper layers, preventing the lead wiring from obstructing other wiring, facilitating the wiring to upper layers, enabling high density wiring to upper layers, and eliminating undone wiring.

Another object of the present invention is to provide a method of wiring in a semiconductor integrated circuit device capable of preventing the utilization factors of individual wiring layers from exceeding 100% so that local wiring congestion does not occur on each wiring layer.

These objectives of the present invention are achieved through the assignment of longer lines to upper layers distant from the terminal layer so that the upper layers have enhanced utilization factors based on a smaller number of lines and the number of wiring to the upper layers is minimized.

The above objectives are achieved by leading terminal lines to upper layers along the shortest, fixed wiring routes. The fixed wiring route mentioned here is to prepare a library of wiring routes from terminals of each cell to upper layers and, in leading a line to an upper layer by using a cell, route the line along a registered wiring route by making reference to the library.

The above objectives are achieved by determining a wiring layer while evaluating the utilization factors of individual wiring layers in order to make even the utilization factors of wiring layers.

By assigning long lines to upper layers distant from the terminal layer, the upper layers can have an increased wiring density by use of a smaller number of lines, and the upper layers can be used efficiently with minimal numbers of bends and overall through holes. Consequently, in leading a terminal line to an upper layer, with terminals being located on the lowest layer, it becomes possible to reduce bends at both ends of the line as shown in FIG. 9 and to reduce the use of overall through holes as shown in FIG. 10.

In general, the number of main lines in the lateral direction is inverse proportional to the length of the main lines as shown in FIG. 7A. Accordingly, by assigning $\alpha\%$ of long main lines to upper layers, $\beta\%$ ($\alpha < \beta$) of the total wiring length in the lateral direction can be assigned to the upper layers as shown in FIG. 7B so that these layers can be used efficiently.

In the case of leading a line to an upper layer, the length of bent wiring can be minimized by using the shortest fixed wiring route which has been prepared in advance.

One advantage of using the fixed wiring route is that terminals are treated as if they are located on the highest layer when seen from the automatic wiring program, since lines from terminals to upper layers are provided through automatic development based on the library. The conventional automatic wiring program is used intact to make wiring on the first, second and third layers based on 3-layer wiring of the second, third and fourth layers, with part of terminals being left on the first layer, and, as a result, wiring of the first through fourth layers can be done based on the conventional wiring algorithm.

Another advantage of using the fixed wiring route is that wiring to upper layers along the shortest wiring routes can be defined and consequently obstruction to other wiring channels can be minimized.

In addition, in assigning wiring routes in the longitudinal direction, the determination of wiring layers for these wiring routes, while assessing the utilization factors of individual wiring layers so that their utilization factors are made even, signifies the determination of wiring layers for wiring routes in the lateral direction, and upper layers can have an increased wiring density.

DESCRIPTION OF THE PREFERRED EMBODIMENT

The wiring method for semiconductor integrated circuit devices based on an embodiment of the present invention will be described in detail with reference to the drawings.

Figure 1:
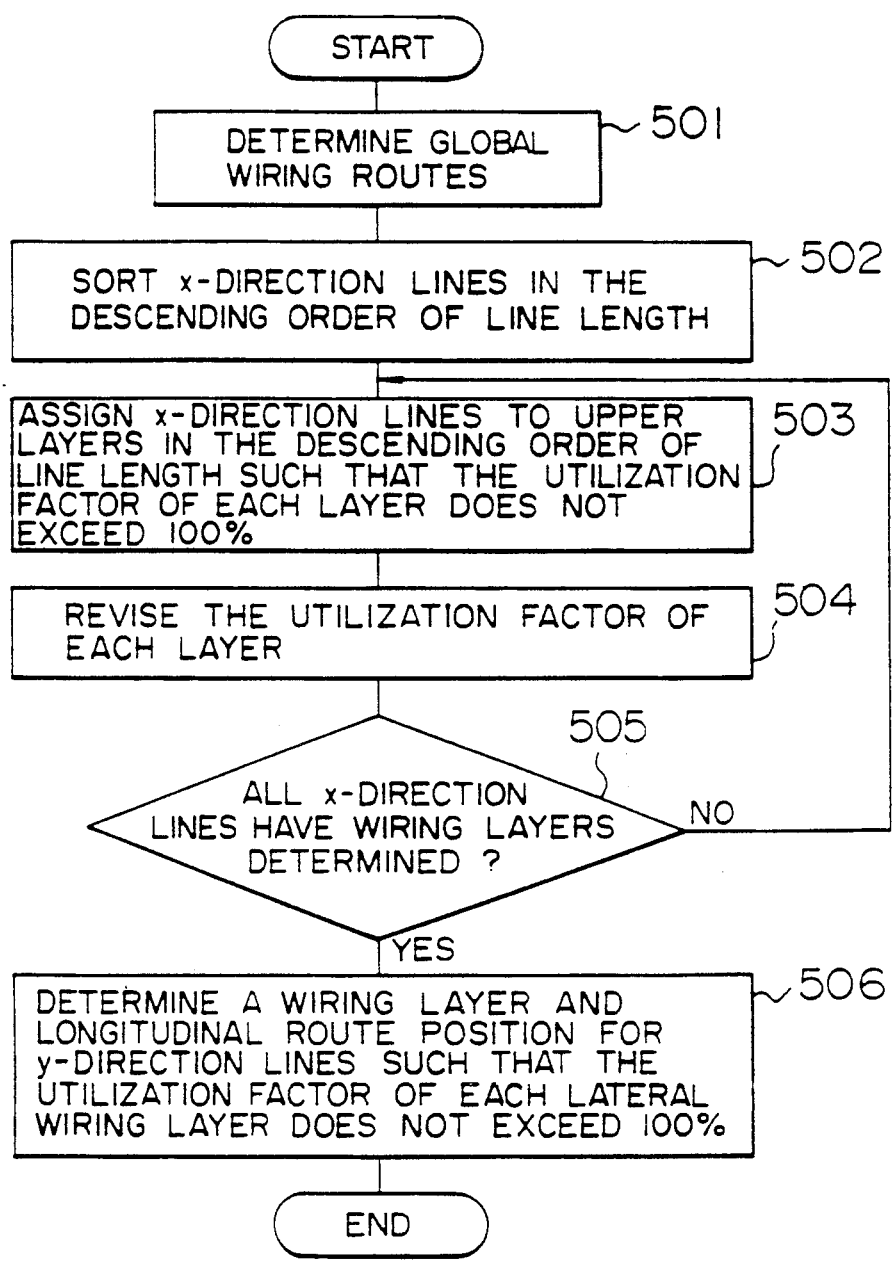
FIG. 1 is a flowchart used to explain the wiring method based on an embodiment of the present invention.
Figure 2:
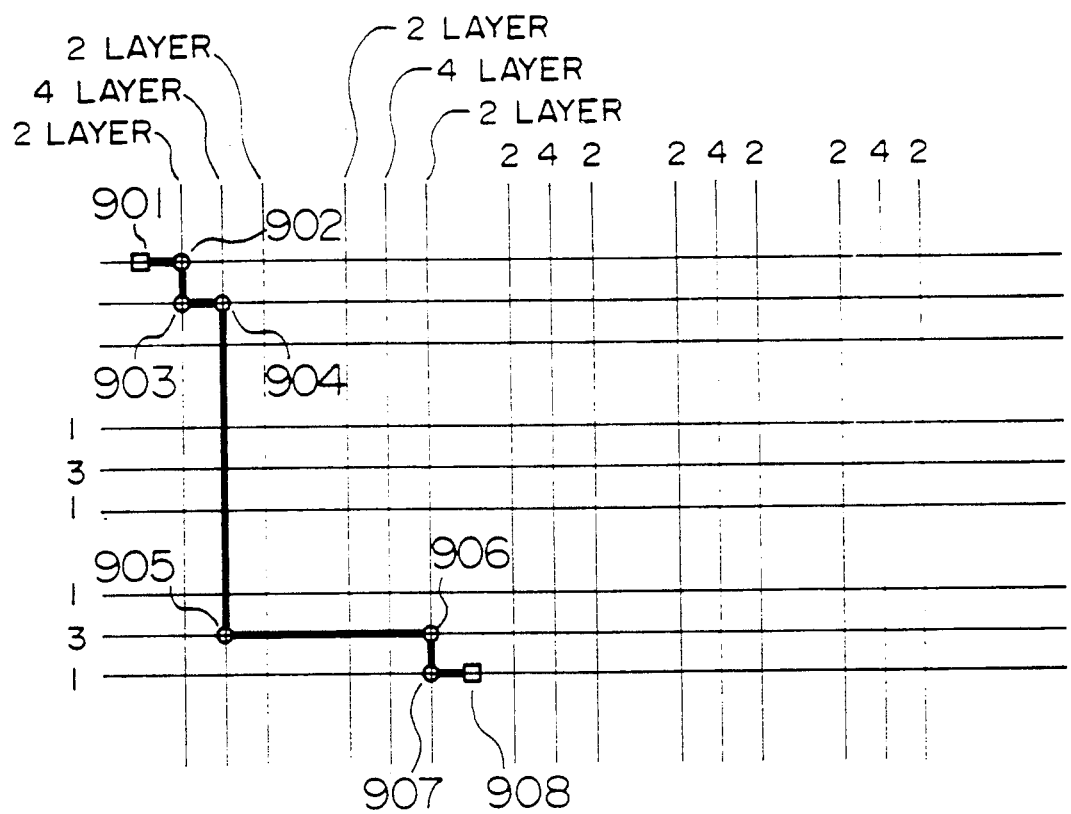
FIG. 2 is a diagram explaining the relation between the wiring direction and the wiring layer.
Figure 3:
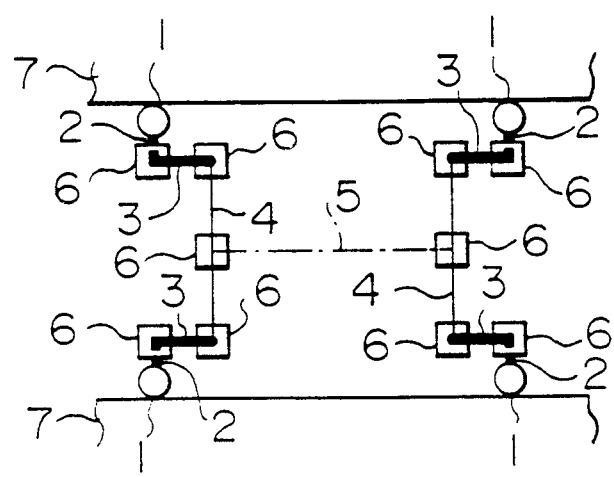
FIG. 3 is a diagram explaining the leading of lines to the fourth layer along the fixed wiring routes.
Figure 4:
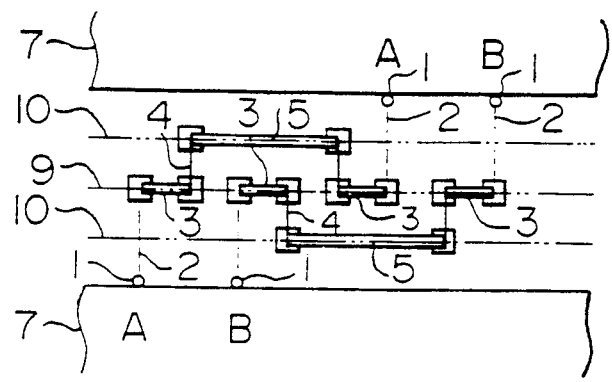
FIGS. 4, 5 and 6 are diagrams showing examples of wiring routes determined based on the inventive method.
Figure 5:
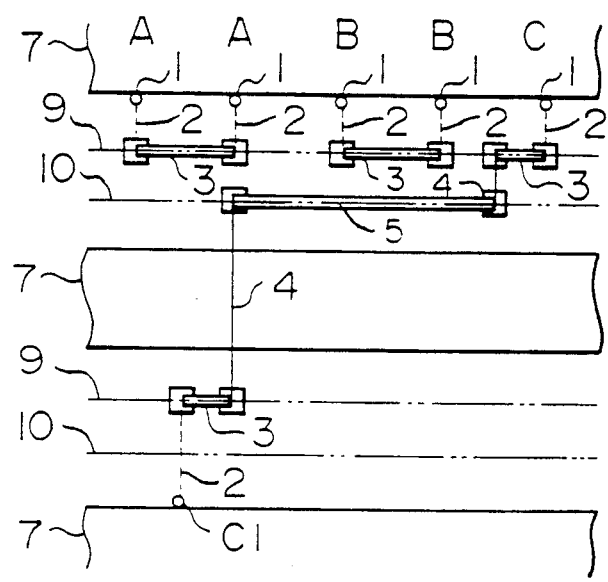
Figure 6:
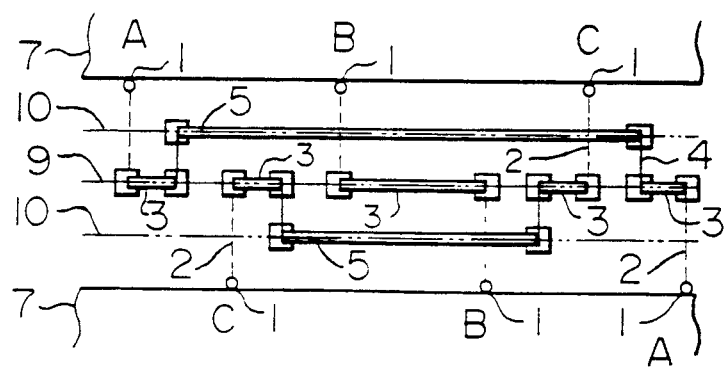
Figure 7A:
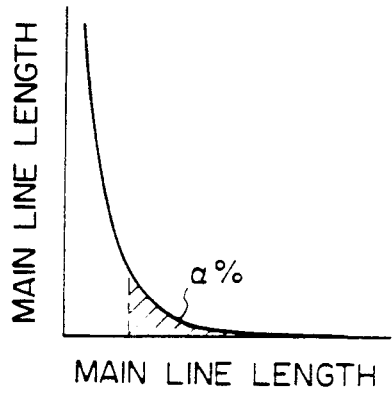
FIGS. 7A and 7B are graphs showing the relation between the length of main lines of lateral wiring and the number of lines and percentage in the total wiring length.
Figure 7B:
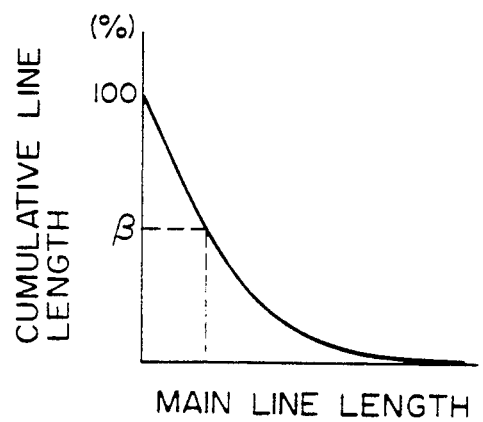
Figure 8:
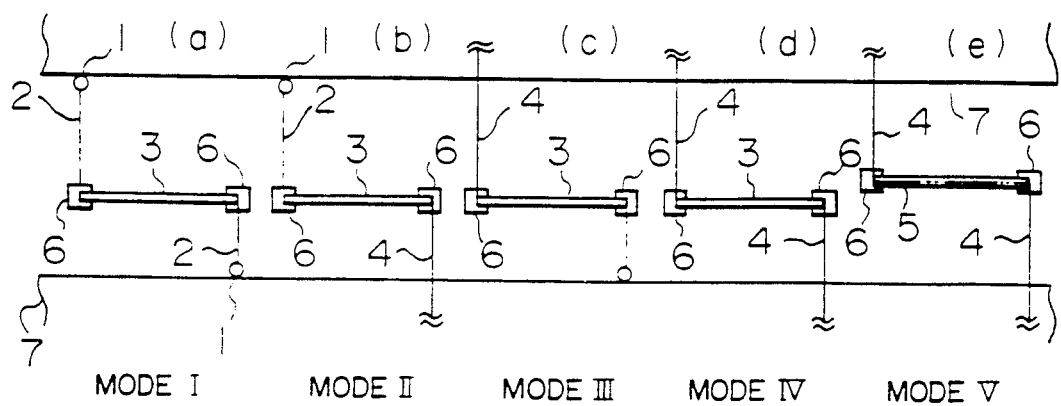
FIG. 8 is a diagram showing the wiring modes of 4-layer wiring based on the conventional technique.
Figure 9:
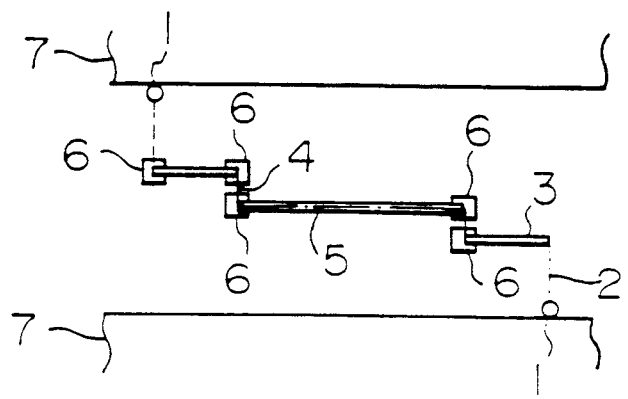
FIGS. 9 and 10 are diagrams explaining the leading of lines on the first layer to the fourth layer.
Figure 10:
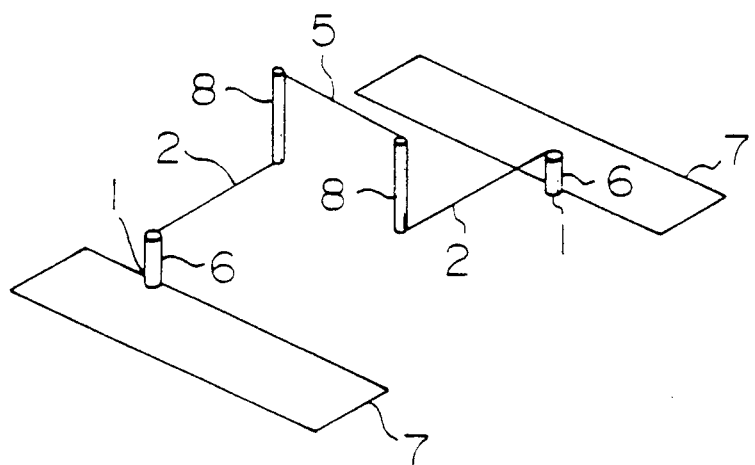

FIG. 1 is a flowchart used to explain the inventive method, FIG. 2 is a diagram showing the relation between the wiring direction and the wiring layer, FIG. 3 is a diagram showing the leading of lines to the fourth layer along the fixed wiring routes, and FIGS. 4, 5 and 6 are diagrams showing examples of wiring routes determined by the inventive method. Symbols used in FIGS. 3-6 correspond to those in FIGS. 8-13.

Initially, the relation between the wiring direction and the wiring layer will be explained. In a semiconductor integrated circuit device, the relation between the wiring direction and the wiring layer is such that the first and third wiring layers in the lateral direction are formed so that lines on these layers do not overlap in the thickness direction and the second and fourth wiring layers in the longitudinal direction are formed so that lines on these layers do not overlap in the thickness direction, as shown for example in FIG. 2.

Accordingly, for connecting a point 901 and point 908 by using all of the first through fourth wiring layers, the point 901 is connected to a point 902 on the first layer, then connected to the second layer by a through hole, the point 902 is connected to a point 903 on the second layer, then connected to the third layer by a through hole, the point 903 is connected to a point 904 on the third layer, then connected to the fourth layer by a through hole, the point 904 is connected to a point 905 on the fourth layer, and, by reversely following the procedure similar to that explained above, the point 905 is routed up to the point 908.

It will be appreciated from the above example that direct wiring from the first layer to the third layer and direct wiring from the second layer to the fourth layer are not possible in general. One exception is irregular wiring routes, in which case direct wiring between these layers is possible.

Next, the operation for implementing the inventive method, which is intended for high density wiring on upper layers without obstructing other wiring and for minimizing the number of through holes, will be explained with reference to the flowchart of FIG. 1.

(1) Initially, global wiring routes are determined on the macro coordinate system without consideration of wiring layers (step 501).

(2) Lines in the x direction are sorted in the descending order of line length on the macro coordinate system, and the lines are assigned to upper wiring layers in the descending order of line length such that the utilization factor of each wiring layer does not exceed 100% (steps 502, 503).

(3) After wiring layers in the x direction have been determined, the utilization factors of individual wiring layers are revised, and it is tested whether the process of assigning wiring layers for all wiring routes in the x direction has completed (steps 504, 505).

(4) If the step 505 reveals the incompletion of the assignment process, the program sequence returns to step 503 to repeat the process. If the step 505 reveals the completion of the assignment process, positions of longitudinal lead wiring routes are determined such that the utilization factors of individual wiring layers in the x direction do not exceed 100% (step 506).

The assignment process of step 503 may be conducted in the ascending order of line length for lower wiring layers.

The foregoing process, based on the embodiment of the present invention, determines the wiring in a semiconductor integrated circuit device to create wiring patterns as shown in FIGS. 4, 5 and 6 without leaving undone wiring.

Figure 11:
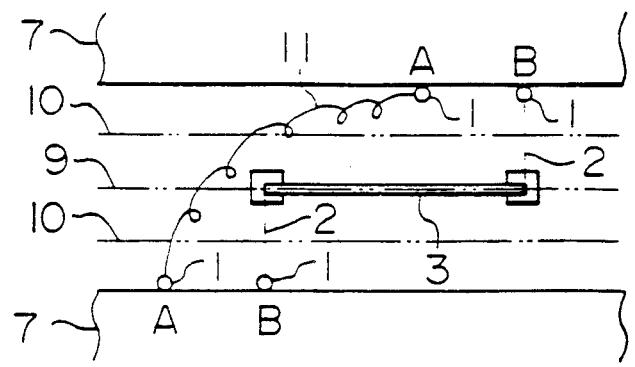
FIGS. 11, 12 and 13 are diagrams explaining the occurrence of undone wiring resulting from the conventional technique.

Shown in FIG. 4 corresponds to the wiring shown in FIG. 11 which is based on the conventional technique, and the second layer for the connection to the fourth layer is counted in its utilization factor and wiring between terminals B is done on the fourth layer. According to this embodiment of invention, it becomes possible to interconnect terminals A with a fourth layer line 5 instead of leaving it as undone wiring.

Figure 12:
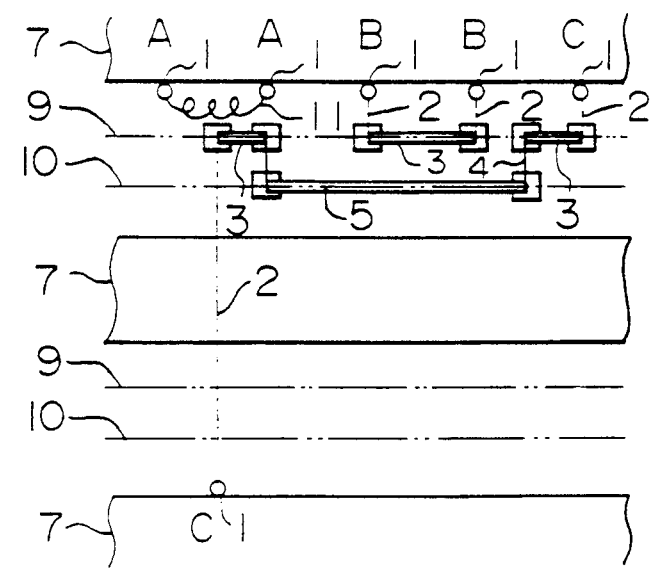

Shown in FIG. 5 corresponds to the wiring across a cell row shown in FIG. 12 based on the conventional technique. In the example of FIG. 12, the fourth layer is for wiring in the x direction and the first layer is for wiring in the y direction, with bends being created on the second and third layers, resulting in the undone wiring 11. Whereas, the inventive method shown in FIG. 5 assigns a line for interconnecting the terminals C along the y direction to the third layer, thereby preventing the occurrence of undone wiring.

Figure 13:
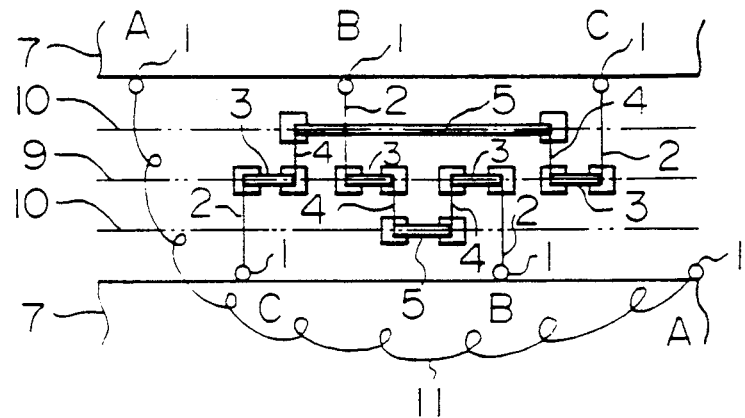

Shown in FIG. 6 is an example of preventing undone wiring 11 for the interconnection of terminals A by assigning short lines in the x direction shown in FIG. 13 to the fourth layer for the interconnection of terminals B. Namely, through the assignment of lines for the interconnection of terminals A and terminals C in the descending order to line length in the x direction to the fourth layer, the occurrence of undone wiring can be prevented.

The foregoing embodiment of the present invention can be used in unison with a means of leading terminals of cell rows to upper layers through the wiring along the fixed wiring routes.

FIG. 3 shows the affair of leading cell terminals to the fourth layer along the fixed wiring routes, in which terminals on the lowest layer are wired in minimum distances from the first layer to the fourth layer through intermediate layers. These fixed wiring routes for individual cells of a semiconductor integrated circuit device are stored in a library, and it can be accessed during the wiring process based on the foregoing embodiment of invention.

Although an embodiment of the present invention has been explained for the case of four wiring layers, the invention is also applicable to devices having more than four wiring layers.

With the foregoing embodiment of the present invention being applied to the master slice LSI, it becomes possible to shorten the chip route, reduce the number of undone wirings, and consequently reduce the time of LSI packaging design. In addition, it can reduce the chip area of customized LSI devices and reduce their manufacturing cost.

According to the present invention, as described above, the length of lead lines from the terminal layer to distant upper layers can be minimized, the lead wiring can be prevented from obstructing other wiring, wiring to upper layers can be facilitated, wiring on upper layers can be done densely, and undone wiring can be eliminated.

We claim:

1. A method of wiring in a semiconductor integrated circuit device having four or more wiring layers, with the lowest layer being a terminal layer, or first layer, wherein long lines are formed as upper layers in descending order to the terminal layer.

2. A method of wiring in a semiconductor integrated circuit device having four or more wiring layers, with the lowest layer being a terminal layer, or first layer, wherein lines are formed as upper layers in the descending order of line length or lines are formed as lower layers in the ascending order of line length.

3. A wiring method for a semiconductor integrated circuit device having four or more wiring layers, with the lowest layer being a terminal layer, or first layer, wherein long lines are formed as upper layers in descending order to the terminal layer; and lead lines from said terminal layer to upper layers are wired along preset fixed wiring routes.

4. A wiring method for a semiconductor integrated circuit device according to claim 2, wherein lead lines from said terminal layer to upper layers are wired along preset fixed wiring routes.

5. A wiring method for a semiconductor integrated circuit device having four or more wiring layers, with the lowest layer being a terminal layer, or first layer, wherein long lines are formed as upper layers in descending order to the terminal layer, and lead lines to upper layers are formed such that the line utilization factor of each wiring layer does not exceed 100%.

6. A wiring method for a semiconductor integrated circuit device according to claim 2, wherein lead lines to upper layers are formed such that the line utilization factor of each wiring layer does not exceed 100%.

7. A wiring method for a semiconductor integrated circuit device according to claim 3, wherein lead lines to upper layers are formed such that the line utilization factor of each wiring layer does not exceed 100%.

8. A wiring method for a semiconductor integrated circuit device according to claim 4, wherein lead lines to upper layers are formed such that the line utilization factor of each wiring layer does not exceed 100%.

9. A wiring method for a semiconductor integrated circuit device having four or more wiring layers, with the lowest layer being a terminal layer, or first layer, wherein long lines are formed as upper layers, and a wiring layer for a line in the x direction to be connected to a line in the y direction is determined depending on the position of the y-direction line, with said position of y-direction line being determined such that the utilization factor of the x-direction line does not exceed 100%.

10. A wiring method for a semiconductor integrated circuit device according to claim 2, wherein a wiring layer for a line in the x direction to be connected to a line in the y direction is determined depending on the position of the y-direction line, with said position of y-direction line being determined such that the utilization factor of the x-direction line does not exceed 100%.

11. A wiring method for a semiconductor integrated circuit device according to claim 3, wherein a wiring layer for a line in the x direction to be connected to a line in the y direction is determined depending on the position of the y-direction line, with said position of y-direction line being determined such that the utilization factor of the x-direction line does not exceed 100%.

12. A wiring method for a semiconductor integrated circuit device according to claim 4, wherein a wiring layer for a line in the x direction to be connected to a line in the y direction is determined depending on the position of the y-direction line, with said position of y-direction line being determined such that the utilization factor of the x-direction line does not exceed 100%.

13. A wiring method for a semiconductor integrated circuit device according to claim 5, wherein a wiring layer for a line in the x direction to be connected to a line in the y direction is determined depending on the position of the y-direction line, with said position of y-direction line being determined such that the utilization factor of the x-direction line does not exceed 100%.

14. A wiring method for a semiconductor integrated circuit device according to claim 6, wherein a wiring layer for a line in the x direction to be connected to a line in the y direction is determined depending on the position of the y-direction line, with said position of y-direction line being determined such that the utilization factor of the x-direction line does not exceed 100%.

15. A wiring method for a semiconductor integrated circuit device according to claim 7, wherein a wiring layer for a line in the x direction to be connected to a line in the y direction is determined depending on the position of the y-direction line, with said position of y-direction line being determined such that the utilization factor of the x-direction line does not exceed 100%.

16. A wiring method for a semiconductor integrated circuit device according to claim 8, wherein a wiring layer for a line in the x direction to be connected to a line in the y direction is determined depending on the position of the y-direction line, with said position of y-direction line being determined such that the utilization factor of the x-direction line does not exceed 100%.

17. A method of wiring in a semiconductor integrated circuit device having four or more wiring layers, with the lowest layer being a terminal layer, or first layer, wherein brief wiring routes are determined initially, lines in the x direction are rearranged in the descending order of line length, the x-direction lines are formed as upper layers in the ascending order of line length, and, after all x-direction lines have been formed such that the utilization factor of each wiring layer does not exceed 100%, route positions for lines in the y direction are determined such that the utilization factors of all wiring layers do not exceed 100%.

18. A method of wiring in a semiconductor integrated circuit having four wiring layers, wherein a lowest layer of said four wiring layers is a terminal layer for terminals, said method comprising the steps of:
 a) sorting a plurality of lines to be formed as said four wiring layers in descending order of line length, wherein said plurality of lines are to be disposed horizontally in said semiconductor integrated circuit;
 b) forming each of said plurality of lines to said four wiring layers by starting with a longest line of said plurality of lines and beginning with an uppermost layer of said four wiring layers; and
 c) forming a particular line of said plurality of lines to a next lower layer of the four wiring layers if, when attempting to dispose said particular line in a present layer of the four wiring layers, no wiring area remains in that present layer.

* * * * *